(12) United States Patent
Suzuki et al.

(10) Patent No.: US 6,198,217 B1
(45) Date of Patent: Mar. 6, 2001

(54) ORGANIC ELECTROLUMINESCENT DEVICE HAVING A PROTECTIVE COVERING COMPRISING ORGANIC AND INORGANIC LAYERS

(75) Inventors: Mutsumi Suzuki, Yokohama; Masao Fukuyama, Tokyo; Yoshikazu Hori, Kawasaki, all of (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/074,421

(22) Filed: May 8, 1998

(30) Foreign Application Priority Data

May 12, 1997 (JP) .................................. 9-121226

(51) Int. Cl.⁷ .............................. H01J 1/62; H01J 63/04
(52) U.S. Cl. .......................... 313/504; 313/506; 313/507; 313/509; 313/512
(58) Field of Search .................................. 313/501, 504, 313/505, 506, 507, 509, 512

(56) References Cited

U.S. PATENT DOCUMENTS

| 5,036,249 | * | 7/1991 | Pike-Biegunski et al. | 313/512 X |
| 5,124,204 | * | 6/1992 | Yamashita et al. | 313/512 X |
| 5,189,405 | * | 2/1993 | Yamashita et al. | 313/512 |
| 5,771,562 | * | 6/1998 | Harvey, III et al. | 313/512 X |
| 5,811,177 | * | 9/1998 | Shi et al. | 313/512 X |
| 5,952,778 | * | 9/1999 | Haskal et al. | 313/512 X |

FOREIGN PATENT DOCUMENTS

| 4-212284 | 8/1992 | (JP) . |
| 4-267097 | 9/1992 | (JP) . |
| 5-182759 | 7/1993 | (JP) . |
| 7-192866 | 7/1995 | (JP) . |

\* cited by examiner

Primary Examiner—Nimeshkumar D. Patel
Assistant Examiner—Mack Haynes
(74) Attorney, Agent, or Firm—McDermott, Will & Emery

(57) ABSTRACT

An organic electroluminescent device comprises an electroluminescent unit having an organic layer structure provided between a pair of electrodes and capable of emitting light on application of a voltage thereto. The electroluminescent unit is covered with a protective double layer made of an organic barrier layer and an inorganic barrier layer formed on the unit in this order.

12 Claims, 2 Drawing Sheets

ORGANIC ELECTROLUMINESCENT DEVICE HAVING A PROTECTIVE COVERING COMPRISING ORGANIC AND INORGANIC LAYERS

BACKGROUND OF THE INVENTION

1. Field of the Invention

This invention relates to an electroluminescent device which has utility in various types of display devices, and more particularly, to an organic electroluminescent device which works at low drive voltage and has a high luminance and good stability.

2. Description of the Prior Art

Electroluminescent devices are self-luminescent in nature, and are thus brighter than liquid crystal devices, ensuring a clear display. Accordingly, research works have long studied such devices. Existing electroluminescent devices, which arrive at a level in practical use, are those which make use of inorganic materials such as ZnS. However, such inorganic electroluminescent devices are not in wide use because their drive voltage for light emission is as high as 200 V or over.

On the contrary, organic electroluminescent devices, which utilize light-emitting organic materials, have still been far from the practical level. In 1987, C. W. Tang et al of Eastman Kodak Co., Ltd. developed a built-up structure device, with a drastic advance in characteristic performance. More particularly, the device has a built-up structure which includes a fluorescent body having a stable deposited film and capable of transporting electrons, and an organic film capable of transporting holes. The carrier from the both are charged into the fluorescent body, with a success in light emission. This organic electroluminescent device has a much improved luminescent efficiency, and is capable of emission at 1000 $cd/m^2$ or more on application of a voltage of 10 V or below. Thereafter, many researchers have made studies on the improvements of characteristics. At present, a light-emitting characteristic of 10,000 $cd/m^2$ or over is obtained.

The fundamental light-emitting characteristic of the organic device has been within a satisfactory serviceable range, but the most serious problem, which should be overcome in order to realize the practical use of the organic device, resides in the shortage of stability. More particularly, the organic electroluminescent device is disadvantageous in that its emission luminance lowers, and a non-light-emitting region, usually called "dark spot", appears, with their area being enlarged from the spot or spots.

The dark spot is caused and facilitated to develop in the device by the presence of moisture entering from defective portions thereof. In order to suppress moisture from entering, there has been proposed the provision of a sealing layer covering the device therewith (Japanese Laid-open Patent Application Nos. 4-267097 and 7-192866). In the Japanese Laid-open Patent Application No. 4-267097, a first film is formed according to a vapor phase method, such as a vacuum deposition technique, on which a photo-curable resin is coated and cured in situ to form a second layer, thereby forming a built-up protective structure. It is stated that when the protective structure is formed in this way, damages, which are caused at the time of the formation of the second layer, can be mitigated. It is also stated in this publication that this structure is effective in suppressing degradation of an emission intensity. The sealing, protective layer disclosed in the Japanese Laid-open Patent Application No. 7-192866 is one which is made of a mixture of an organic component as used in an organic compound layer in an electroluminescent device and an inorganic oxide. It is set out that this layer is able to suppress the occurrence of dark spot. However, in either case, it is not always satisfactory with respect to the enlargement of a dark spot. This presents a serious problem when the organic electroluminescent device is in service.

SUMMARY OF THE INVENTION

It is an object of the invention to provide an organic electroluminescent device which works at a low drive voltage, and exhibits a high luminance with good stability, and which can overcome the problems involved in the prior art devices.

It is another object of the invention to provide an organic electroluminescent device which can well prevent occurrence of a non-light-emitting region called dark spot and, if present, can suppress the dark spot from enlarging.

The above objects can be attained, according to the present invention, by an electroluminescent device which comprises an electroluminescent unit including a pair of electrodes and an organic layer structure provided between the pair of electrodes and capable of emitting light on application of a voltage thereto via the pair of electrodes, and a protective layer for covering the electroluminescent unit therewith, wherein the protective layer includes an organic barrier layer formed over the electroluminescent unit and an inorganic barrier layer and formed on the organic barrier layer.

The unit in whole is preferably covered with the protective layer, and if the unit is formed on a substrate such as glass, it is covered with the protective layer at exposed portions thereof, which are not in contact with the substrate.

DETAILED DESCRIPTION OF THE PREFERRED EMBODIMENTS

Figure 1:
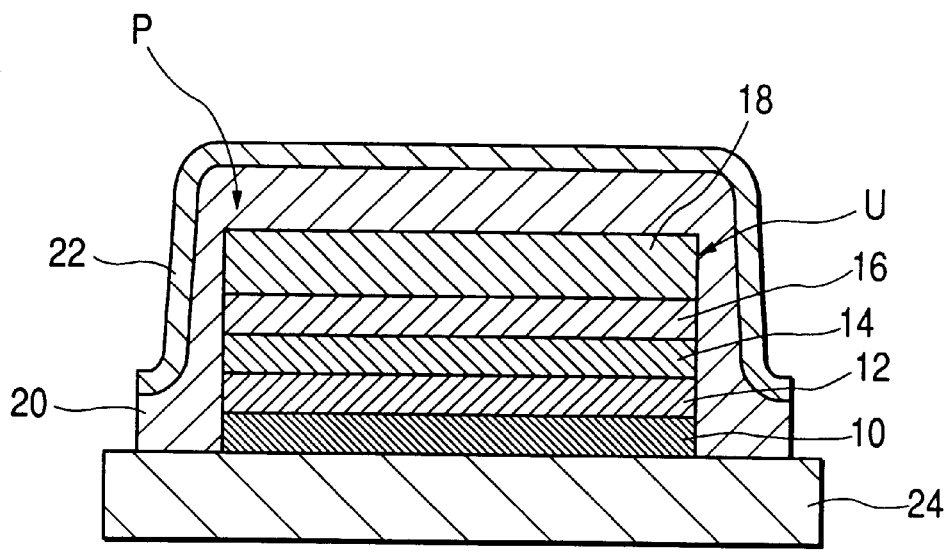
FIG. 1 is a schematic sectional view of an electroluminescent device according to the invention.

The electroluminescent device of the invention is described with reference to the accompanying drawings, particularly, to FIG. 1. In FIG. 1, there is shown an organic electroluminescent device D which includes an electroluminescent unit U. The unit U has an anode 10, a hole transport layer 12, a light-emitting layer 14, an electron transport layer 16, and a cathode 18 arranged in this order as shown. The unit U is further covered with a protective layer P. The protective layer P has an organic barrier layer 20 and an inorganic barrier layer 22. In FIG. 1, although the unit U covered with the protective layer P is supported on a substrate 24, the unit U maybe fully covered with the protective layer P without use of any substrate. Preferably, the unit U is placed on the substrate 24 which is optically transparent.

Fabrication the device D is described.

The anode 10 is first formed usually on an optically transparent, insulating substrate made, for example, of glass or an optically transparent plastic material such as polyesters, polyethylene terephthalate, polyester sulfones or the like. Preferably, the anode 10 is made, for example, of a conductive transparent material, such as indium tin oxide (ITO), zinc aluminium oxide, $Cd_2SnO_4$ or the like, to provide an optically transparent electrode, or a conductive semi-transparent material, such as gold or platinum, to provide an optically semi-transparent electrode. A film of the above-mentioned material is formed on the substrate by vacuum deposition or sputtering, thereby forming an optically transparent or semi-transparent film as the anode 10. This anode 10 is usually formed in a thickness of 0.02 to 0.2 $\mu$m.

Subsequently, the hole transport layer 12 is formed on the anode 10. The hole transport material used preferably has good stability against oxidation and high mobility of holes, is capable of forming a pinhole-free thin film, and is transparent with respect to the fluorescence emitted from the emission layer 14. Typical and preferred materials, which meet the above requirements, triphenylamine derivatives such as 1,1-bis(4-di-p-tolylaminophenyl)cyclohexane, N,N'-diphenyl-N,N'-bis(3-methylphenyl)-1,1'-biphenyl-4,4'-diamine, N,N'-diphenyl-N,N'-bis(p-tolyl)-1,1'-biphenyl-4,4'-diamine, N,N,N',N'-tetra(p-tolyl)-4,4'-diaminobiphenyl, N,N'-bis(4'-diphenylamino)-4-(biphenylyl)-aniline, N,N'-bis(4'-diphenylamino-4-biphenyl)-N,N'-diphenylbenzidine, and the like. Of course, other types of materials, which are ordinarily used for this purpose, may also be used including phthalocyanine derivatives, hydrazone derivatives, stilbene deriatives, oxazole derivatives, triazole derivatives, imidazole derivatives, and polymers having hole transportability such as polyvinyl carbazole, polyvinylparaphenylenevinylidene, and the like.

The hole transport layer 12 is formed on the anode 10 by vacuum deposition by resistance heating. To this end, the above-mentioned materials may be formed as a single layer or a built-up layer of two or more films.

Alternatively, if a hole transport material is used after dispersion in a polymer such as polycarbonate, such a dispersion may be formed on the anode by spin coating or casting. In this case, the hole transport material should preferably be present in the dispersion in amounts not less than 10 wt % based on the dispersion in order to ensure good transportability of the layer. Still alternatively, if a polymer having hole transportability is used, the polymer is dissolved in an appropriate solvent therefor such as chloroform, an aromatic compound such as toluene, or the like, and is spin coated. In either case, the hole transport layer 12 may be made of a single film or a built-up film having a thickness of 0.005 $\mu$m or above, preferably from 0.05 to 1 $\mu$m.

The light-emitting layer 14 is then formed on the hole transport layer 12. The layer 14 should be made of an organic substance capable of emitting fluorescence having a high fluorescent intensity in a visible light range and also capable of forming a thin film. A number of such substances are known in the art, including quinolinol complexes such as tris(8-quinolinol) aluminium, 8-quinolinol lithium, tris(5,7-dichloro-8-quinolinol) aluminium, bis(8-quinolinol) zinc and the like, oxazole complexes such as 1,2-bis(5-methyl-2-benzoxazolyl)ethylene, 2,5-bis(5-tert-butyl-2-benzoxazolyl)thiophene, 2-(4-biphenylyl)-5-phenylbenzoxazole and the like, distyrylbenzene derivatives such as 1,4-bis(p-dimethylaminostyryl)benzene, 1,4-bis(2-naphthyl)styrylbenzene and the like, butadiene derivatives such as 1,4-diphenylbutadiene, 1,1,4,4-tetraphenylbutadiene and the like, and condensed ring compounds such as perylene, coronene, 9,10-diphenylanthracene and the like. These substances may be used singly or in combination. In order to appropriately control the wavelength of light emission and to improve an emission efficiency, two or more substances are preferably used. In this case, two or more substances may be mixed to form a single layer, or may be, respectively, formed as separate layers to form a built-up layer as is known in the art.

The emission layer 14 is usually formed by vacuum deposition by resistance heating or by other known procedures. If such an organic substance as mentioned above is dispersed in a polymer as used in the formation of the layer 12, the resultant dispersion may be subjected to spin coating or casting to form a film. In the case, the substance should be present in amounts not less than 0.01 wt % based on the dispersion. Moreover, if a polymer, such as poly-p-phenylenevinylene, capable for emitting intense fluorescence is used, the polymer may be dissolved in an appropriate solvent therefor, such as toluene or xylene, and spin-coated on the layer 12. This emission layer 14 is generally formed in the thickness of 0.03 to 0.5 $\mu$m.

Thereafter, the electron transport layer 16 is formed on the layer 14. The electron transport layer 16 should be made of a material having great mobility of electrons and capable of forming a pinhole-free thin film. The materials meeting this requirement include, for example, benzoquinolinol complexes as bis(10-benzo[h]quinolinol)beryllium, oxazole complexes as 2(4-biphenylyl)-5-(4-tert-butylphenyl)-1,3,4-oxadiazole.

This layer 16 is also formed by vacuum deposition by resistance heating, or by spin coating or casting after dispersion in polymers as in the case of forming the layer 12. If a polymer having electron transportability is used, such a polymer may be formed by spin coating.

The electron transport layer 16 is preferably formed in a thickness of 0.005 to 1 $\mu$m.

Although not particularly shown in FIG. 1, the light-emitting layer may he so arranged as to serve also as a hole transport layer or as an electron transport layer. In this arrangement, the electroluminescent unit U includes a light-emitting layer serving also as a hole transport layer and the electron transport layer, or the hole transport layer and a light-emitting layer serving also as an electron transport layer. More particularly, if a material for the emission layer has god electron transportability like tris(8-quinolinol) aluminium, an electron transport layer may not always be necessary. Likewise, if a material for the emission layer has good hole transportability, a hole transport layer may be unnecessary. In this case, the unit U has such a structure arrangement of electrode/hole transport layer/electron-transporting emission layer/electrode, or electrode/hole-transporting emission layer/electron transport layer/electrode. Moreover, the emission layer serving also as a hole or electron transport layer may be formed of a uniform dispersion composition which comprises both a material for the emission layer and a material for the hole or electron transport layer. In the case, a mixing ratio between the emission layer material and the hole or electron transport material is preferably about 1:1 on the weight basis. In either case, the thickness of the emission layer is preferably in the range of 0.005 to 1 $\mu$m.

Thereafter, the cathode 18 is formed on an organic layer structure. More particularly, the organic layer structure is composed of a three-layered structure including the hole transport layer 12, the light-emitting or emission layer 14 and the electron transport layer 16, or a two-layered structure including either the emission layer serving also as the hole transport layer and the electron transport layer, or the hole transport layer and the emission layer serving also as the electron transport layer.

The cathode 18 should charge electrons into the organic layer structure and should have good environmental stability. The metals or alloys meeting the above requirement include, for example, metals such as Al, Mg, In, Sn, Zn, Ag and the like, alloys such as Al and Li alloys, Mg and Ag alloys, Ag and Li alloys and the like.

The cathode 18 is formed on the layer structure by resistance heating when using a metal. On the other hand, when an alloy is used, the cathode is formed according to a co-deposition method wherein two types of metals are discharged and deposited from separate evaporation sources by resistance heating under a reduced pressure in the order of magnitude of $10^{-5}$ Torr. or below. The atomic ratio between the metals in the alloy can be determined by controlling the deposition rates of the respective metals. The thickness of the deposited film is determined by monitoring with a thickness gage using a crystal oscillator, and is usually in the range of 0.05 to 1 µm. As a matter of course, the alloy, which has been prepared at a predetermined atomic ratio, may be used for this purpose. Moreover, the anode may be formed not only by resistance heating, but also by an electron beam deposition technique or by sputtering.

In this way, the electroluminescent unit U, which is composed of the organic layer structure sandwiched between a pair of electrodes, i.e. the anode and the cathode, can be formed on the substrate 24.

Usually, the organic layer structure is so arranged as to emit light on application of a voltage of 3 V or over thereto.

The electroluminescent unit U per se is known in the art, and the present invention is characterized by the improvement which comprises a protective or sealing layer covering the electroluminescent unit U therewith. More particularly, when the cathode 18 is formed in a manner as described above, it is inevitable that some pinholes or defects be formed during the course of the formation of the cathode 18, through which moisture in air is adsorbed on the organic layer structure. This will cause the emission luminance from the organic layer structure to lower, and also dark spots to be developed and enlarged.

In the practice of the invention, a protective or sealing layer P is formed to cover the unit U therewith as shown in FIG. 1. The protective layer P includes two layers including an organic barrier layer 20 covering defects or pinholes inevitably formed particularly in the uppermost cathode layer 18, and an inorganic barrier layer 22. It will be noted that defects are mainly caused by foreign matter inevitably deposited on the electroluminescent unit U during the course of the fabrication thereof under very severely controlled conditions.

The organic barrier layer 20, which exhibits good affinity for the metal or alloy cathode, covers defects in the electroluminescent unit U therewith and makes a smooth surface on the relatively irregular surface of the cathode 18. Then, the inorganic barrier layer 22 is formed on the smooth surface of the organic barrier layer 20, thus ensuring the formation of the layer 22, which is substantially defect-free and dense. The thus formed double-layer structure can remarkably contribute to moisture proofing.

The organic barrier layer 20 may be formed from several types of starting materials. Such starting materials include photocurable monomers or oligomers to provide a cured organic layer, thermoplastic resins, and materials having a glass transition point, e.g. polymers or low molecular weight materials When the organic barrier layer 20 is made of a cured resin, the cured resin should preferably be resistant to moisture to an extent. The starting photocurable monomers or oligomers used for this purpose should preferably have low volatility and high melting points. Examples of such monomers include trimethylol acrylates such as trimethylolpropane triacrylate, ditrimethylolpropane tetraacrylate and the like, long-chain acrylates such as 1,6-hexanediol diacrylate, 1,6-hexanediol dimethacrylate and the like, and cyclohexyl acrylates such as dicyclopentenyloxyethyl acrylate, dicyclopentenyloxy acrylate, cyclohexyl methacrylate and the like. Examples of the photocurable oligomers include acrylate oligomers, epoxy acrylate oligomers, urethane acrylate oligomers, ether acrylate oligomers, and the like. For the photocuring, photoinitiators are used including those ordinarily used for this purpose. Examples of the photoinitiators include benzoin ethers, benzophenones, acetophenones, ketals and the like. Benzophenone and benzyldimethyl ketal are preferred.

The monomer or oligomer is applied to the anode layer 18 by spin coating, casting or vacuum deposition. Where spin coating or casting is used, attention should be paid to the fact that if solvents of the type, which can attack the electroluminescent unit U by impregnation through defects of the anode 18 into the organic layer structure, are used, the unit would not work properly, leading to no emission of light in the worst case.

On the other hand, if a vapor phase deposition method, such as vacuum deposition, is used, the organic barrier layer can be formed subsequently to the formation of the anode 18 while keeping an atmosphere under reduced pressure. This is advantageous in that moisture in air can be prevented from deposition on the surface of the unit U.

The thus applied monomer or oligomer is cured by application of actinic light, such as UV light, by a usual manner.

The use of a photocurable monomer or oligomer is also advantageous in that heat is not applied to at all, , and thus, the unit U is not thermally damaged.

The use of the cured organic layer is described above. The organic layer 18 may be formed of a thermoplastic resin or a film-forming material having a glass transition point. The use of a thermoplastic resin or a film-forming material having a glass transition point has the advantage that when the resin or material is formed as a layer and subsequently applied with heat to a softening temperature or a glass transition point, the resin or material layer is softened and can fill fine defects in the cathode therewith.

Examples of the material having a glass transition point include 1,1-bis(4-di-p-tolylaminophenyl)-4-phenylcyclohexane (TPAC), 1,4-bis(p-dimethylaminostyryl)benzene and the like. Likewise, examples of the thermoplastic resin include polyethylene, polymethyl methacrylate, polyethylene terephthalate and the like. These materials or polymers may he applied onto the unit U in the same manner as described with respect to the cured resin.

Where these materials or polymers are used, a once formed layer is preferably subjected to thermal treatment at a temperatures close to the glass transition temperature for the material, or at which the polymer used is softened. The thermal treatment is effective in further improving affinity for the unit U or the coverage or filling of defects, along with some possible defects of the organic barrier layer 20 being repaired. Thus, the thermal treatment is effective in suppressing dark spots from enlarging. It will be noted that where the organic barrier layer 20 is thermally treated, the type of material for the layer 20 should be preferably so selected that the thermal treating temperature is lower than glass transition points of the constituent materials for the organic layer structure of the electroluminescent unit U. The organic barrier layer 20 should preferably be form in a thickness of 0.5 μm or over in order to ensure good coverage of the unit U and to effectively intercept moisture therewith.

The inorganic barrier layer 22 should be made of materials, which exhibit low moisture permeability and are stable against moisture. Examples of the material include oxides such as $SiO_2$, SiO, GeO, $Al_2O_3$ and the like, nitrides such as TiN, $Si_3N_4$ and the like, and metals such as Al, Ag, Au, Pt, Ni and the like. For the film formation, these materials are subjected to a vapor phase technique such as vacuum deposition, sputtering and the like under conditions ordinarily used for these oxides, nitrides or metals. Using the vapor phase technique, there can be formed a dense film without establishing any space relative to the organic barrier layer 20. This ensures better barrier properties against moisture. The thickness of the inorganic barrier layer 22 is usually in the range of 0.1 to 2 μm.

It will be noted that in FIG. 1, the inorganic barrier layer 22 is depicted as not covering at lower end faces of the organic barrier layer 20, but if no problem is involved in wirings for the transparent electrode, it is preferred to cover the end faces with the barrier layer 22.

These barrier layers 20, 22 may be successively formed after the formation of the electroluminescent unit U while keeping reduced pressure conditions, under which the unit is fabricated, as they are. In this case, the unit U is not exposed to air so that moisture in air can be prevented from adsorption thereon. This is effective in preventing dark spots from being formed or enlarged due to the presence of moisture when the device is under working conditions.

Figure 2:
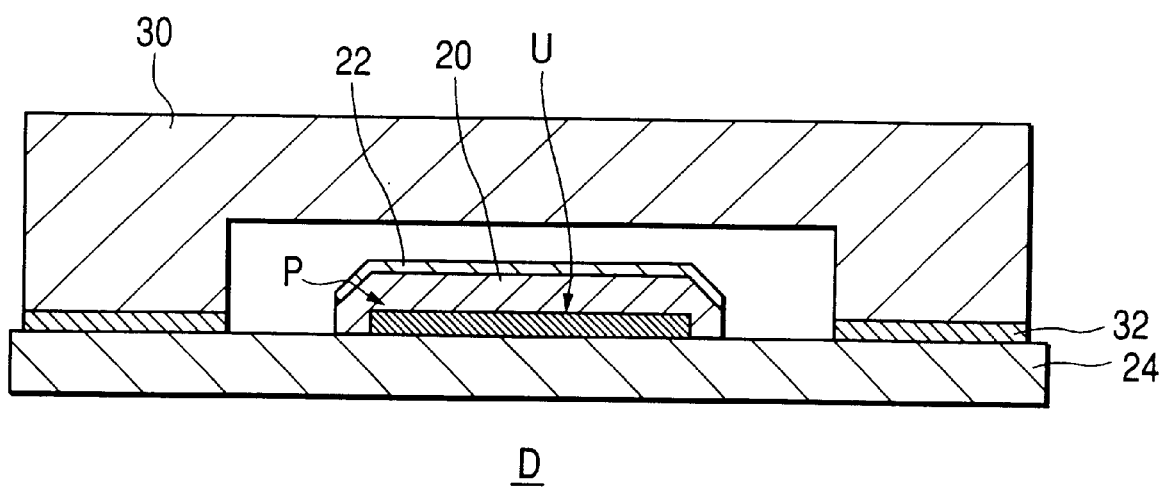
FIG. 2 is a schematic sectional view showing a device according to another embodiment of the invention.

FIG. 2 shows another embodiment of the invention, in which like reference numerals indicate like parts or members. In the figure, an electroluminescent device D includes an electroluminescent unit U covered with a protective layer P having an organic barrier layer 20 and an inorganic barrier layer 22 as shown. The protective layer P can be formed very thin. Accordingly, the device D formed with the protective layer P may be further attached with a member or film having low moisture permeability. Such a mexnber is, for example, a glass substrate or a low moisture-permeable film such as of polyethylene or polymethyl methacrylate. For the attachment, an epoxy resin adhesive is conveniently used. In the figure, a member 30, which is so shaped as not to directly contact with the device D, is provided to cover the device D and bonded to the substrate 24 by means of an adhesive 30 such as an epoxy resin. If a film or a flat substrate is used, the adhesive is applied to the entire surface thereof, to which the device D is bonded.

The invention is described in more detail by way of examples, in which N,N'-bis(p-t-butylphenyl)-N,N'-diphenylbenzidine) was used as a hole transport material, tris(8-hydroxyquinolinol)aluminium (Alq) as an electron transport material, and an AlLi alloy having an atomic ratio between Al and Li of 100:1 as a cathode. Moreover, the electroluminescent unit was formed in the order of anode, hole transport layer, electron-transporting emission layer and cathode. The examples should not be construed as limiting the invention thereto.

EXAMPLE 1

A transparent glass substrate, on which an indium tin oxide (ITO) film had been preliminarily formed as an anode, was washed well with pure water, and set in a vacuum chamber, followed by continuously forming a 50 nm thick hole transport layer, a 50 nm thick electron-transporting, emission layer, and a 150 nm thick cathode while keeping reduced pressure conditions at $5 \times 10^{-6}$ Torr, thereby obtaining an electroluminescent unit.

This unit was removed from the chamber, and coated thereover with a UV-curable monomer without use of any solvent according to a spin coating method and irradiated with UV light for 1 minute to form a 50 μm thick cured resin barrier layer. The thus formed unit was again set in the vacuum chamber, and was vacuum deposited with silver in a thickness of 150 nm to form a silver barrier layer on the cured resin barrier layer.

For comparison, three electroluminescent units were, respectively, made in the same manner as described above. One of the units was formed with no protective layer to provide an electroluminescent device, another unit was formed only with such a cured resin layer without formation of any Ag barrier layer, and the other unit was formed only with the Ag barrier layer. These devices were assessed along with the device of the invention.

Figure 3:
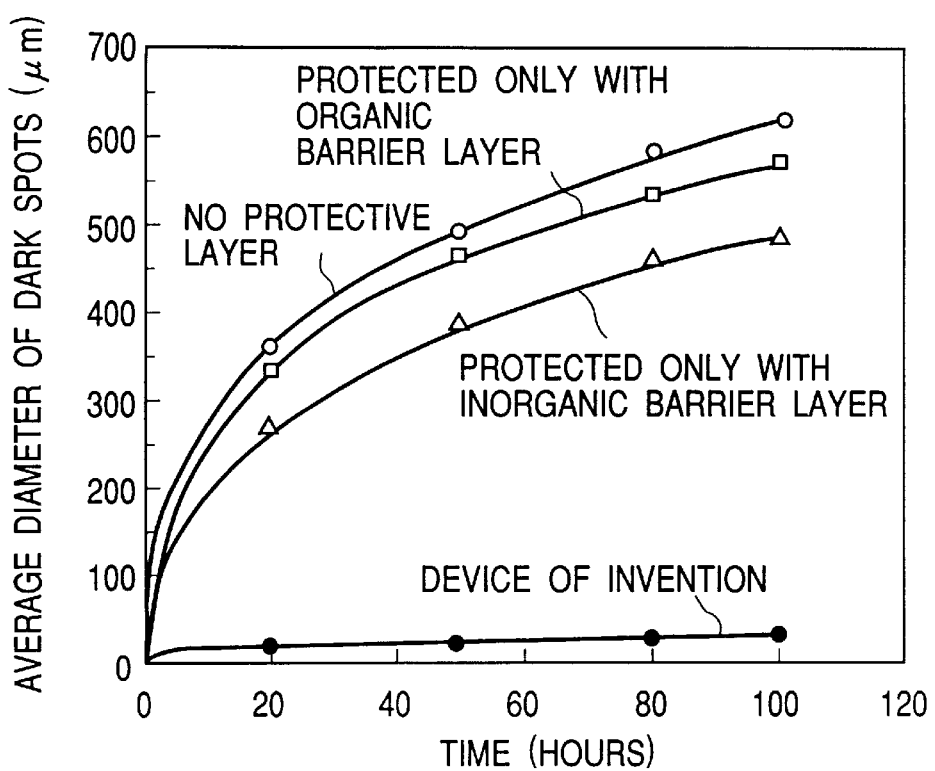
FIG. 3 is a graph showing the relation between the average diameter of dark spots and the time, comparing an electroluminescent device of the invention with other types of devices.

More particularly, each device was placed under conditions of 40° C. and 90% R. H., over 100 hours. The average value of diameters of dark spots in the respective devices in relation to the variation in time is shown in FIG. 3. It will be noted that the respective devices had 15 dark spots/mm² on average with an average diameter of 15 μm.

As will be apparent from the figure, the non-protected device had an average diameter as large as 621 μm. The device protected with the protective layer according to the invention had an average diameter as small as 27 μm after 100 hours. The comparison between the device of the invention and the device having only the cured resin layer or the Ag layer reveals that the device of the invention is far superior in storage stability to those devices.

EXAMPLE 2

The electroluminescent unit was made in the same manner as in Example 1. Subsequently, 1,1-bis(4-di-p-tolylaminophenyl)-4-phenyl-cyclohexane (TPAC) was vacuum deposited on the anode layer in a thickness of 0.5 μm as the organic barrier layer, followed by thermal treatment at its glass transition temperature of 75° C. for 30 minutes. Thereafter, aluminium was vacuum deposited on the organic barrier layer in a thickness of 150 nm.

The resultant device was placed under conditions of 40° C. and 90% R. H. over 100 hours, revealing that an average diameter of dark spots was 25 μm. Little change was found on the device when visually observed. Thus, it was found that the device having the protective layer according to the invention was appreciably improved in storage stability.

EXAMPLE 3

The electroluminescent unit was made in the same manner as in Example 1. Subsequently, TPAC was vacuum deposited on the anode layer in different thicknesses of 0.2 μm, 0.5 μm, 1 μm and 2 μm, followed by thermal treatment at 75° C., which was a glass transition point of TPAC. Aluminium was further vacuum deposited over the each of the TPAC layer in a thickness of 150 nm.

Figure 4:
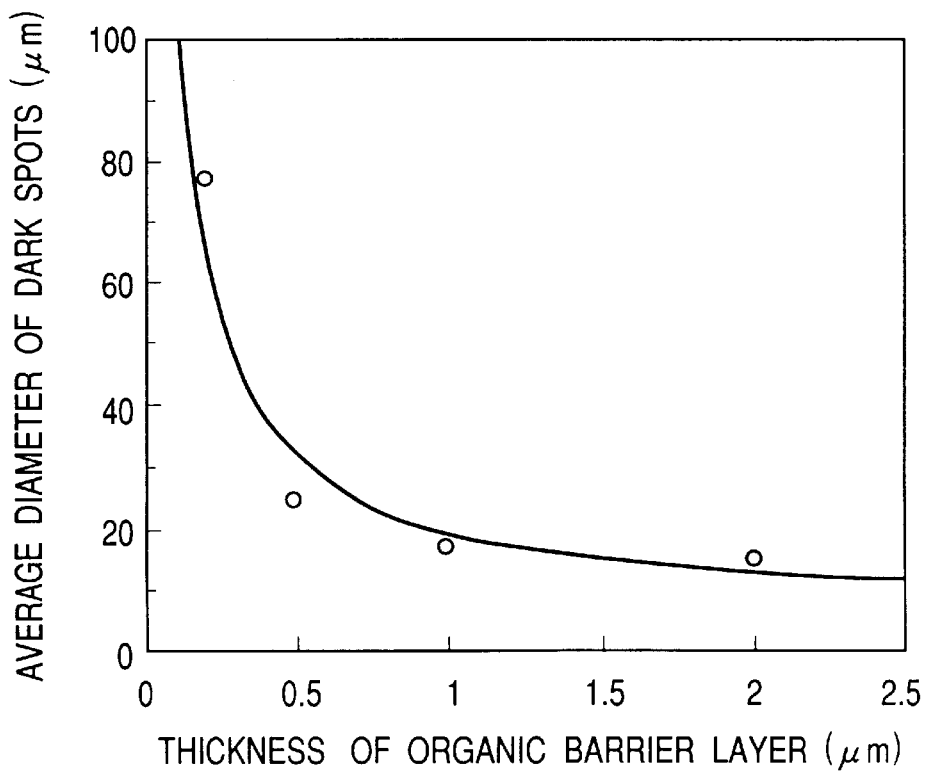
FIG. 4 is a graph showing the relation between the average diameter of dark spots and the thickness of an organic layer when an electroluminescent device of the invention is allowed to stand under conditions of 40° C. and 90% R.H. (relative humidity) over 100 hours.

The devices were, respectively, placed under conditions of 40° C. and 90% R.H. over 100 hours. The results are shown in FIG. 4, wherein an average value of diameters of dark spots were plotted against the thickness of the organic barrier layer. As will be apparent from the figure, the sealing effect is significant when the layer thickness is 0.5 or over.

EXAMPLE 4

In the same manner as in Example 1, the electroluminescent device was made except that the Ag barrier layer was not formed. This device was set in a vacuum chamber, and silicon dioxide ($SiO_2$) was vacuum deposited on the cured resin layer as an inorganic barrier layer.

The resultant device was placed under conditions of 40° C. 90% R.H. over 100 hours, revealing that an average diameter of dark spots was around 18 $\mu$m and little variation was visually observed. Thus, it was found that the device having the protective layer of the invention was remarkably improved in storage stability.

EXAMPLE 5

A device of the type shown in FIG. 2 was fabricated. The electroluminescent unit U was made in the same manner as in Example 1, followed by vacuum depositing TPAC in a thickness of 2 mm, thermal treating the resulting TPAC layer at 75° C. to form an organic barrier layer on the anode layer, and vacuum depositing Al in a thickness of 150 nm to form an inorganic barrier layer while keeping reduced pressure conditions used to make the unit U.

Thereafter, the resultant device was removed from the vacuum chamber, and a glass plate of an inverted U shape, as shown in FIG. 2, was bonded to the glass substrate of the device in an atmosphere of nitrogen so that the glass plate was not in contact with the device.

For comparison, the above procedure was repeated without use of any protective layer, but covered with the glass plate.

Two types of devices were, respectively, placed under conditions of 40° C. and 90% R.H. over 1000 hours, revealing that an average diameter of dark spots was 23 $\mu$m for the device of the invention and 105 $\mu$m for the device for comparison. Thus, the use of the protective layer according to the invention contributes greatly to an improvement in storage stability.

What is claimed is:

1. In an organic electroluminescent device comprising an electroluminescent unit including a pair of electrodes and an organic layer structure provided between the pair of electrodes and capable of emitting light on application of a voltage thereto via the pair of electrodes, and a dual layer protective covering formed on said electrolumescent unit, wherein said dual layer consists of a single organic barrier layer covering and in contact with said electroluminescent unit and a single inorganic barrier layer formed on said organic barrier layer.

2. An organic electroluminescent device according to claim 1, further comprising a substrate on which said electroluminescent unit is formed.

3. An organic electroluminescent device according to claim 1, wherein said organic barrier layer is made of a photocured resin.

4. An organic electroluminescent device according to claim 1, wherein said organic barrier layer is made of a material having a glass transition point, and is thermally treated at or near the glass transition point.

5. An organic electroluminescent device according to claim 1, wherein said organic barrier layer is made of a thermoplastic resin, and is thermally treated at or near a softening temperature of the resin.

6. An organic electroluminescent device according to claim 1, wherein said organic barrier layer is formed by a vapor phase technique.

7. An organic electroluminescent device according to claim 1, wherein said organic barrier layer has a thickness of 0.5 $\mu$m or over.

8. An organic electroluminescent device according to claim 1, wherein said inorganic barrier layer is made of a member selected from the group consisting of oxides and nitrides.

9. An organic electroluminescent device according to claim 1, wherein said inorganic barrier layer is made of a metal.

10. An organic electroluminescent device according to claim 1, wherein said inorganic barrier layer is formed according to a vapor phase technique.

11. An organic electroluminescent device according to claim 1, further comprising a low moisture-permeable substrate or film bonded to said device.

12. An organic electroluminescent device according to claim 11, wherein said substrate is bonded to said device so that said substrate is not in contact with said electroluminescent unit.

* * * * *